（12）United States Patent
Smith

(10) Patent No.: US 7,355,450 B1
(45) Date of Patent: Apr. 8, 2008

(54) DIFFERENTIAL INPUT BUFFERS FOR LOW POWER SUPPLY

(75) Inventor: Mian Smith, Los Altos, CA (US)

(73) Assignee: Altera Corporation, San Jose, CA (US)

( * ) Notice: Subject to any disclaimer, the term of this patent is extended or adjusted under 35 U.S.C. 154(b) by 340 days.

(21) Appl. No.: 11/139,159

(22) Filed: May 27, 2005

(51) Int. Cl.
*H03K 19/0175* (2006.01)

(52) U.S. Cl. .................. 326/83; 328/27; 327/112

(58) Field of Classification Search .............. 326/26, 326/27, 82–87, 112, 119, 121; 327/98, 112
See application file for complete search history.

(56) References Cited

U.S. PATENT DOCUMENTS

| | | | |
|---|---|---|---|
| 5,250,856 A | 10/1993 | Burton et al. | |
| 5,327,021 A | 7/1994 | Kanai et al. | |
| 5,355,035 A | 10/1994 | Vora et al. | |
| 5,440,248 A | 8/1995 | Brown et al. | |
| 5,604,460 A | 2/1997 | Sehrig et al. | |
| 5,990,708 A | 11/1999 | Hu | |
| 6,020,761 A | 2/2000 | Hwang et al. | |
| 6,023,175 A | 2/2000 | Nunomiya et al. | |
| 6,037,842 A * | 3/2000 | Bryan et al. | 331/57 |
| 6,064,226 A | 5/2000 | Earl | |
| 6,137,306 A | 10/2000 | Hirata et al. | |
| 6,218,858 B1 * | 4/2001 | Menon et al. | 326/39 |
| 6,236,231 B1 | 5/2001 | Nguyen et al. | |
| 6,327,190 B1 | 12/2001 | Kim et al. | |
| 6,392,453 B1 | 5/2002 | Morzano et al. | |
| 6,486,713 B2 | 11/2002 | Wright et al. | |
| 6,801,080 B1 | 10/2004 | Arcus | |
| 6,825,692 B1 | 11/2004 | Chung et al. | |
| 7,102,545 B2 * | 9/2006 | Choi | 341/56 |
| 7,215,143 B1 | 5/2007 | Chung et al. | |
| 2002/0190776 A1 * | 12/2002 | Wang et al. | 327/333 |
| 2007/0046332 A1 * | 3/2007 | Tanaka | 326/83 |
| 2007/0057702 A1 * | 3/2007 | Suenaga | 327/108 |

FOREIGN PATENT DOCUMENTS

EP 0818734 A2 1/1998

* cited by examiner

*Primary Examiner*—Don Le
(74) *Attorney, Agent, or Firm*—Townsend and Townsend and Crew LLP

(57) ABSTRACT

A differential input buffer that can operate at lower power supply voltages and can receive differential input signals with wide common mode rage. In various embodiments, the invention combines native or depletion mode metal-oxide-semiconductor (MOS) transistors with the conventional enhancement mode n-channel (NMOS) and p-channel (PMOS) transistors in the design of the input buffer. The native or depletion MOS transistors can operate at lower power supply voltages and increase the input common-mode voltage range.

29 Claims, 5 Drawing Sheets

DIFFERENTIAL INPUT BUFFERS FOR LOW POWER SUPPLY

BACKGROUND

The present invention relates in general to integrated circuits and in particular to differential input circuits.

To meet the demands of today's applications, integrated circuits are being designed to operate at higher speeds with lower power supply voltages. One technique for enabling high frequency operation at lower voltages is differential signaling. In differential signaling, logic levels are represented by the difference between a pair of complementary signals. Instead of processing signals that swing between the power supplies, circuits designed to process differential signals need only detect a relatively small difference in voltage between the two complementary signals. The much smaller voltage swing and the lower voltage level characteristics of differential signaling facilitate high speed operation at lower voltages.

Integrated circuits that receive differential signals require a differential input buffer that properly detects the logic level of the received signal. The design of a differential input buffer is generally dictated by a set of specifications that defines the speed and input voltage level range. For example, to receive LVDS signals, a differential input buffer is required to properly detect the logic levels of the differential input signal over a relatively wide common mode range. The common mode voltage of the LVDS input signal (Vin,cm) may range from 0 volts to 2.4 volts. This places stringent requirements on the operation of the input buffer. For example, an input buffer that includes a differential input pair of n-channel transistors can properly detect a differential input signal as long as Vin,cm remains high enough to overcome the threshold voltage of the n-channel transistors. When Vin,cm approaches 0 volts neither of the n-channel input transistors in the differential pair can turn on, resulting in the failure of the circuit to properly detect the LVDS logic levels. Constructing the differential input pair with p-channel transistor will similarly fail at the higher Vin,cm levels.

A number of innovative circuit techniques addressing the above and other constraints when designing differential input buffers, are described in commonly-owned U.S. Pat. No. 6,236,231, to Nguyen et al., which is hereby incorporated by reference in its entirety. There, the inventors connected two differential input pairs in parallel receiving the differential input signal; one pair with n-channel input transistors (n-diff pair) and the other pair with p-channel input transistors (p-diff pair). With this design, the n-diff pair operates at the higher end of the input common mode voltage Vin,cm, and as the Vin,cm moves toward 0 volts the n-diff pair turns off but the p-diff pair turns on to detect the input signal. This expands the operational range of the input circuit.

The parallel n-diff pair and p-diff pair input buffer works well as long as the power supply voltage VCC remains above the sum of the n-channel transistor threshold voltage Vtn and the absolute magnitude of the p-channel transistor threshold voltage |Vtp|, (i.e., VCC>[Vtn+|Vtp|]). For example, given an n-channel threshold voltage Vtn of 0.7 volts and a p-channel threshold voltage Vtp of −0.7 volts, the power supply voltage for the differential input buffer must be greater than 1.4 volts in order for the circuit to be functional. If the power supply voltage drops below 1.4 volts, there will be a voltage range within which neither the n-channel transistors nor the p-channel transistors has high enough gate-to-source (Vgs) voltage to turn on. In the above example, with a power supply voltage VCC of 1.2 volts, an input differential signal with a common mode voltage around 0.6 volts will not be sufficient to turn on either the p-channel transistor or the n-channel transistor.

To overcome the above problem that is encountered at lower power supply voltages, either a separate and higher power supply for the I/O circuitry can be provided, or the Vin,cm can be shifted away from the failure region. Both these solutions, however, have limitations and drawbacks. The separate I/O power supply can introduce additional I/O noise and if provided externally requires additional power pad and bus routing. Shifting the common mode voltage away from the failure region requires extra control circuitry that adds to circuit complexity and limits the frequency of operation of the circuit.

There is therefore a need for further improvements in design of differential output buffers that efficiently enable the circuit to operate with low power supply voltages.

SUMMARY

The present invention provides differential input buffers that can receive differential input signals with wide common mode rage while operating at lower power supply voltages. In various embodiments, the invention combines native or depletion mode metal-oxide-semiconductor (MOS) transistors with the conventional enhancement mode n-channel (NMOS) and p-channel (PMOS) transistors in the design of the input buffer. The native or depletion MOS transistors can operate at lower power supply voltages and increase the input common-mode voltage range. Special techniques are developed to turn off the native or depletion MOS transistors gradually to maintain a substantially constant gain for the input buffer across the wider operational common-mode voltage range.

In one embodiment, the present invention combines an NMOS differential input pair with a native MOS differential input pair both of which receive the differential input signal at their inputs. A turn-off circuit with stacked transistors operates to gradually turn off the tail current for the native MOS differential input pair in response to the differential input signal. The two differential input pairs can share the load devices for the second stage of the buffer. In another embodiment, the invention combines three differential pair input circuits: one made of NMOS input transistors, a second one made of native MOS input transistors and a third one made of depletion MOS input transistors. All three differential input pairs receive the differential input signal at their inputs. The native MOS input pair and the depletion MOS input pair are turned off gradually by a circuit that turns off their respective tail currents. In this embodiment too all three differential input pairs can share the load devices for their second stage. In yet another embodiment, the invention combines three differential pair input circuits: one made of NMOS input transistors, a second one made of native MOS input transistors and a third one made of PMOS input transistors. All three differential input pairs receive the differential input signal at their inputs. The native MOS input pair and the PMOS input pair are turned off gradually by a circuit that turns off their respective tail currents. In this embodiment, the NMOS and native MOS differential input pairs can share the load devices for their second stage, with a separate load circuit for the PMOS input pair. In the above embodiments, any one of the multiple differential input pairs can be made to be programmably enabled or disabled depending on the input voltage requirements.

A better understanding of the nature and advantages of the present invention will be gained with reference to the following detailed description and the accompanying drawings.

DETAILED DESCRIPTION

Figure 1:
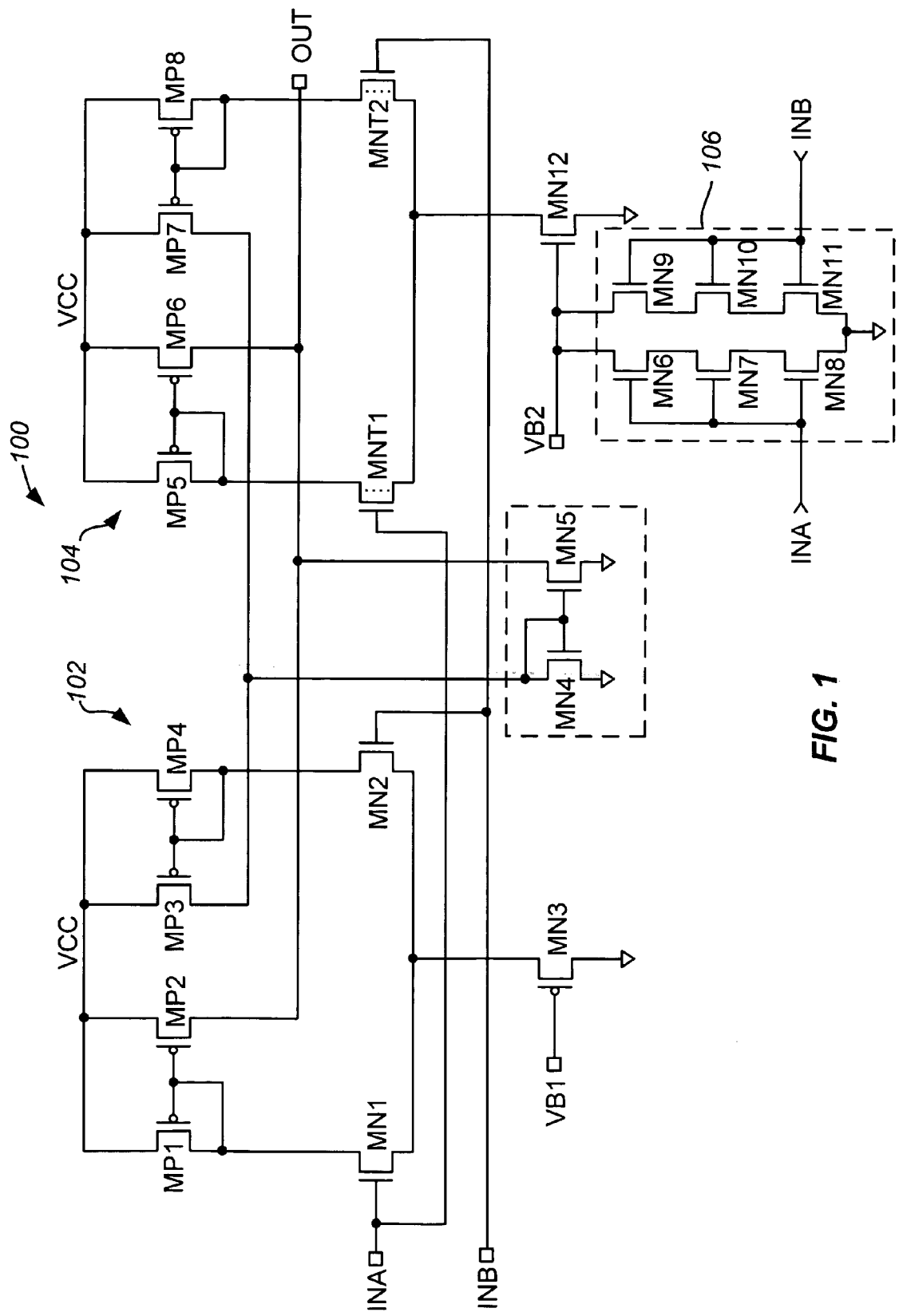
FIG. 1 is a circuit diagram for an exemplary implementation of a differential input buffer according to one embodiment of the present invention.

FIG. 1 is a circuit diagram of a differential input buffer 100 according to one embodiment of the present invention. In the exemplary implementation shown in FIG. 1, differential input buffer 100 includes a first differential pair (or differential amplifier) 102 with source-coupled enhancement mode n-channel (NMOS) input transistors MN1 and MN2 that receive a differential input signal at their gate terminals connected to inputs INA and INB. First differential pair 102 includes load devices made of p-channel (PMOS) transistors MP1 and MP4 that respectively connect between n-channel transistors MN1 and MN2, and VCC. First differential pair 102 further includes an n-channel tail transistor MN3 that receives a first bias voltage VB1 at its gate to set the tail current for the differential pair. P-channel transistors MP2 and MP3 along with n-channel transistors MN4 and MN5 form the second stage of differential pair 102 connecting to output node OUT. In this configuration, input buffer 100 has a single-ended output. With minor variation to the second stage, both output legs of the differential pairs can be tapped to make a fully differential input buffer.

Input buffer 100 also includes a second differential pair 104 made of source-coupled native MOS transistors MNT1 and MNT2 with their gate terminals coupled to input terminals INA and INB, respectively. Second differential pair 104 also includes load devices made of p-channel transistors MP5 and MP8 that respectively connect between native transistors MNT1 and MNT2, and VCC. Second differential pair 104 further includes an n-channel tail transistor MN12 that receives a second bias voltage VB2 at its gate to set the tail current for the differential pair. The second stage of second differential pair 104 includes p-channel transistors MP6 and MP7 that share load devices MN4 and MN5 with the second stage of first differential pair 102. P-channel transistors MP6 and MP7 connect to VCC and load transistors MP5 and MP8, respectively. A circuit 106 connects to the gate terminal of tail transistors MN12 to turn off transistor MN12 when differential pair 104 is to be turned off. Circuit 106 includes multiple—in this example three— stacked transistors MN6, MN7 and MN8 connected in series between the gate terminal of tail transistor MN12 and ground (or VSS), with their gate terminals connected to input terminal INA. Circuit 106 further includes stacked transistors MN9, MN10 and MN11 similarly connected in series between the gate terminal of tail transistor MN12 and ground, with their gate terminals connected to input terminal INB.

In a conventional complementary metal-oxide-semiconductor (CMOS) process, the threshold voltages for n-channel (Vtn) and p-channel (Vtp) transistors are set by threshold implants into the respective transistor channel regions. Typical values for transistor threshold voltages may be Vtn=|Vtp|=0.7 volts. A native transistor is typically an n-channel type transistor that does not receive any channel doping for threshold adjustment. The resulting native transistor exhibits an intrinsic threshold voltage around, for example, 0 volts. Thus, with input transistors having a threshold voltage near 0 volts, differential pair 104 can be turned on and can properly detect a differential input signal with a common mode voltage Vin,cm around 0 volts. Second differential pair 104 remains operational and responsive to a differential input signal as the common mode voltage of the input signal increases above 0 volts. First differential pair 102 starts responding to the differential input signal when Vin,cm goes above the threshold voltage Vtn of enhancement mode n-channel transistors MN1 and MN2 in first differential pair 102. It is desirable to turn off second differential pair 104 at about the same time when first differential pair 102 turns on. From that point on, first differential pair 102 takes over responding to the differential input signal in the upper range of Vin,cm.

Because of the much lower threshold voltage of the native transistors, care should be taken in turning them off. That is, in a circuit where logic signals swing between, for example, ground (or 0 volts) and VCC, a native transistor having a Vt,ntv of 0 volts cannot be turned off. Further to avoid an abrupt change in the overall transconductance of input circuit 100, it is preferable to turn off second differential pair 104 in a gradual manner. In the embodiment shown in FIG. 1, differential pair 104 with native input transistors MNT1 and MNT2 is turned off by gradually cutting off its tail current. This is accomplished by circuit 106 that connects to the gate terminal of tail transistor MN12. Circuit 106 roughly replicates the structure of a differential circuit with each leg having three transistors serially-connected between the gate terminal of tail transistor MN12 and ground. All gate terminals of transistors MN6, MN7 and MN8 in one leg receive one input signal at INA and all gate terminals of MN9, MN10 and MN11 in the other leg receive the other input signal at INB. In this fashion, as Vin,cm reaches above one Vtn, one of MN8/MN11 turns on, while the corresponding one of transistors MN7/MN10 and MN6/MN9 are turned on with some delay due to the source-bias effect. The bias voltage at VB2 thus gradually drops and once all three transistors in one leg of circuit 106 fully turn on, VB2 is shorted to ground. This in turn causes transistor MN12 to turn off completely shutting off second differential pair 104. Because the stacking of transistors in shut off circuit 106 approximates the structure of differential pair 102, its operation also provides a good degree of compensation for variations in process and temperature.

Input buffer 100 can thus operate with lower power supply voltages without the need for any special processing steps, or a dedicated I/O power supply and its attendant noise concerns, or extra power supply pad and routing. Input buffer 100 operates such that the switching between one or the other of the differential pairs occurs automatically without the need for extra control circuitry. This plus the sharing of parts of the circuitry between the two differential pairs results in a compact design. Additional benefits of input circuit 100 include high speed of operation and no increase in the DC current of the circuit.

Figure 2:
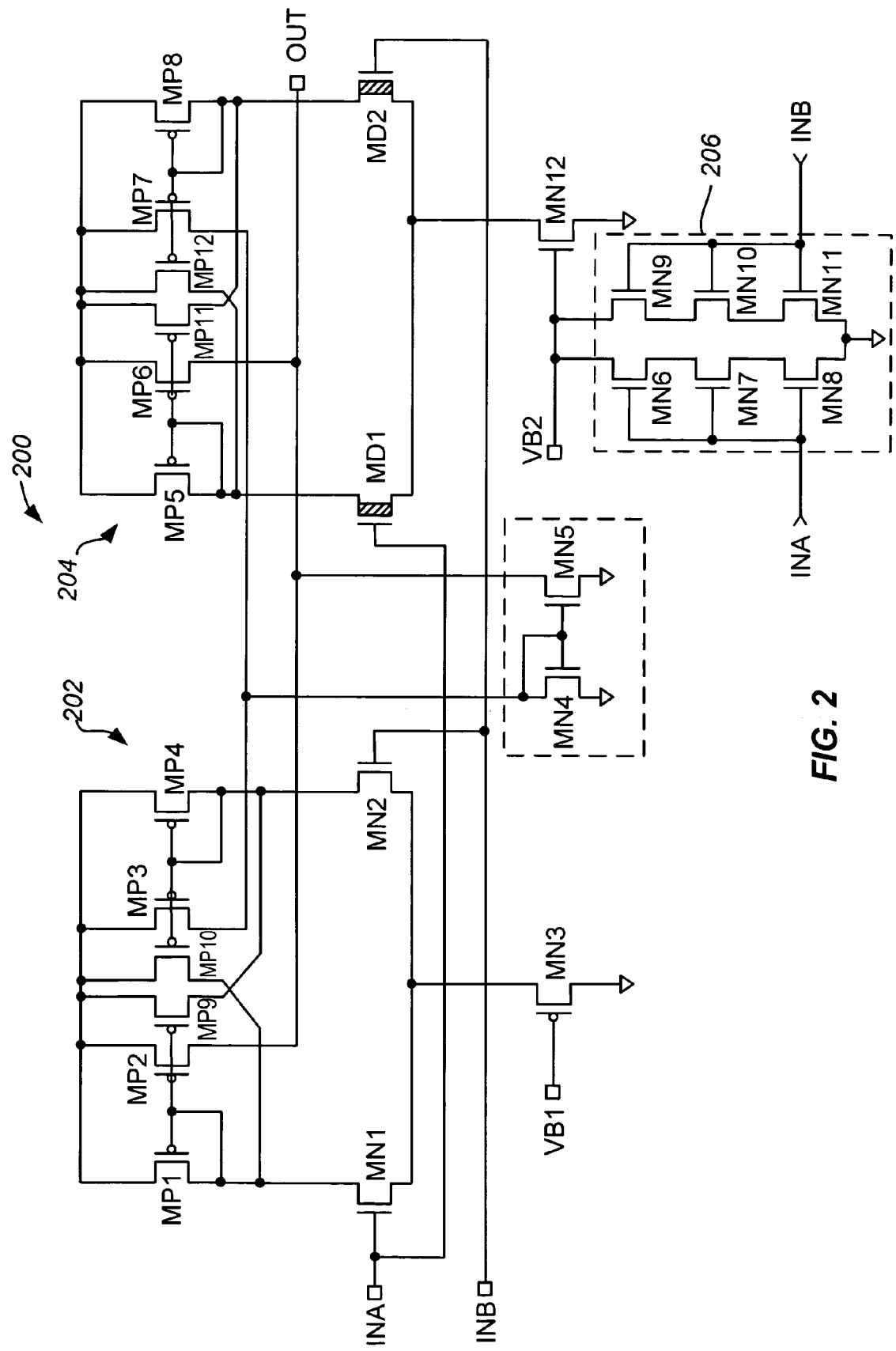
FIG. 2 shows an alternative embodiment for the differential input buffer shown in FIG. 1.

Modifications and variations to differential input circuit 100 are possible. For example, a pair of cross-coupled transistors can be added to the load devices in each differential pair to improve the performance of the buffer. Additional cross-coupled transistors can either help provide hysteresis or increased gain depending on the ratio of their size to the size of the load transistors. In another embodiment, instead of native transistors, second differential pair 104 uses depletion mode input transistors that enable the input circuit to operate at even lower power supply voltages. An exemplary implementation that uses the depletion mode input transistors combined with the added cross-coupled load circuit is shown in FIG. 2. Differential input buffer 200 of FIG. 2 has a similar structure to that of FIG. 1 in that it includes two differential pairs 202 and 204 connected in parallel to differential input terminals INA/INB and output terminal OUT. In FIG. 2, the same identifiers are used to designate the same circuit elements as those in FIG. 1. Accordingly, with the exception of the added p-channel transistors MP9 and MP10 that are cross-coupled to the outputs of differential pair 202, the circuit of differential pair 202 is identical to differential pair 102 in FIG. 1. Depending on the size of the cross-coupled p-channel transistors MP9 and MP10, they can either provide hysteresis or increased gain. If cross-coupled transistors MP9 and MP10 are larger than load transistors MP1 and MP4, they provide hysteresis in the response of the differential pair to the differential input signal. That is, transistors MP9 and MP10 operate such that differential pair 202 resists erroneous toggling in response to possible noise on the differential input signal at inputs INA and INB. If, on the other hand, transistors MP9 and MP10 are made smaller than load transistors MP1 and MP4, they increase the gain of differential amplifier 202. It is to be understood that while the added cross-coupled load transistors can be advantageously employed in every differential pair in every one of the embodiments described herein, they are optional.

Referring back to FIG. 2, second differential pair 204 is constructed similarly to first differential pair 202 except instead of native MOS transistors, differential pair 204 uses depletion mode transistors MD1 and MD2 as its input transistors. The use of depletion mode input transistors allows input buffer 200 to operate at even lower power supply voltages as compared to buffer 100 since the threshold voltage for a depletion mode n-channel transistor is negative. The formation of the n-channel depletion mode transistors requires implanting of n-type impurities into their channel region resulting in a threshold voltage Vtd in the range of, for example, ~0 volt to ~−1.0 volt. Buffer 200 operates similarly to buffer 100 of FIG. 1 in every other respect.

Figure 3:
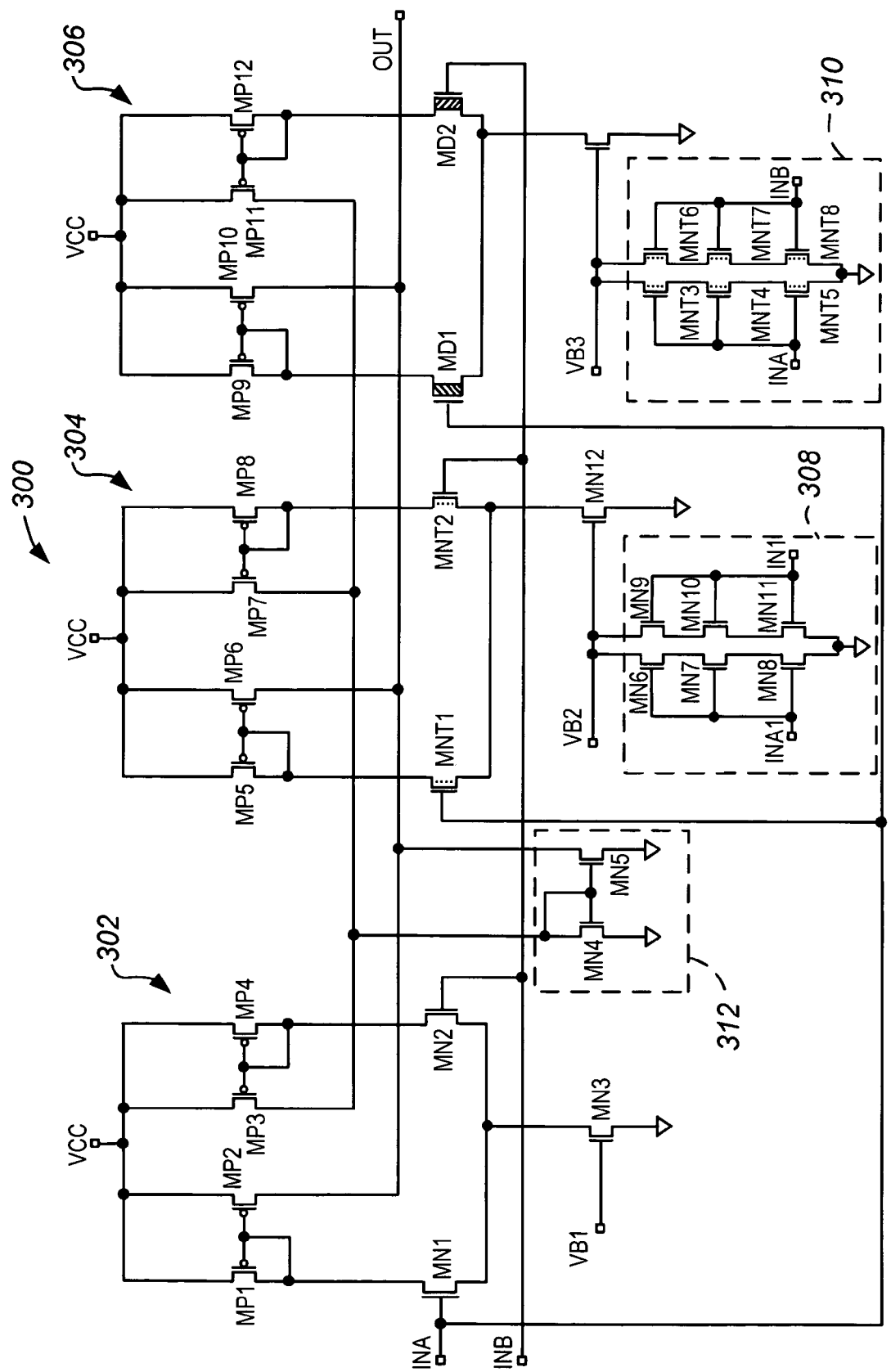
FIG. 3 is a circuit diagram of a differential input buffer according to a different exemplary embodiment of the present inventions.

To further expand the common mode range of the differential input buffer, the present invention provides, in another embodiment, an input buffer with three differential pairs connected in parallel. Referring to FIG. 3, there is shown a differential input buffer 300 that includes a first differential pair 302 made of enhancement mode n-channel input transistors MN1 and MN2, a second differential pair 304 made of native MOS input transistors MNT1 and MNT2, and a third differential pair 306 made of depletion mode n-channel transistors MD1 and MD2, all coupled in parallel between differential input terminals INA and INB and output terminal OUT. Each differential pair is constructed as in the previous embodiments. First differential pair 302 with n-channel input transistors MN1 and MN2 is identical to differential pair 102 in the embodiment shown in FIG. 1, and although not shown may include additional cross-coupled load transistors to increase gain or provide hysteresis. Second differential pair 304 with native input transistors MNT1 and MNT2 is identical to second differential pair 104 in the embodiment shown in FIG. 1, and although not shown may include additional cross-coupled load transistors to increase gain or provide hysteresis. Third differential pair 306 is similar to differential pair 204 in the embodiment shown in FIG. 2 except that instead of enhancement mode n-channel transistors in its shut-off circuit 310, it employs native transistors. Because all the input transistors for all three differential pairs are n-channel transistors, in a single-ended output configuration, all three differential pairs can share the n-channel load devices (MN4/MN5) for their second stage.

In operation, each differential pair automatically turns on or off in response to the differential input signal depending on Vin,cm. For input common mode voltage Vin,cm ranging below 0 volts, third differential pair 306 with depletion mode input transistors MD1 and MD2 operates to detect the input logic levels, while the other two differential pairs 302 and 304 remain turned off. In the range 0V<Vin,cm<1V, third differential pair 306 gradually turns off and second differential pair 304 turns on to detect the input logic levels, while differential pair 302 remains off. As Vin,cm reaches 1 volt and increases beyond 1 volt, second differential pair 304 gradually turns off and first differential pair 302 turns on. All this occurs automatically in response to the differential input signal level and without the need for extra switches to turn any of the differential pairs on or off.

Figure 4:
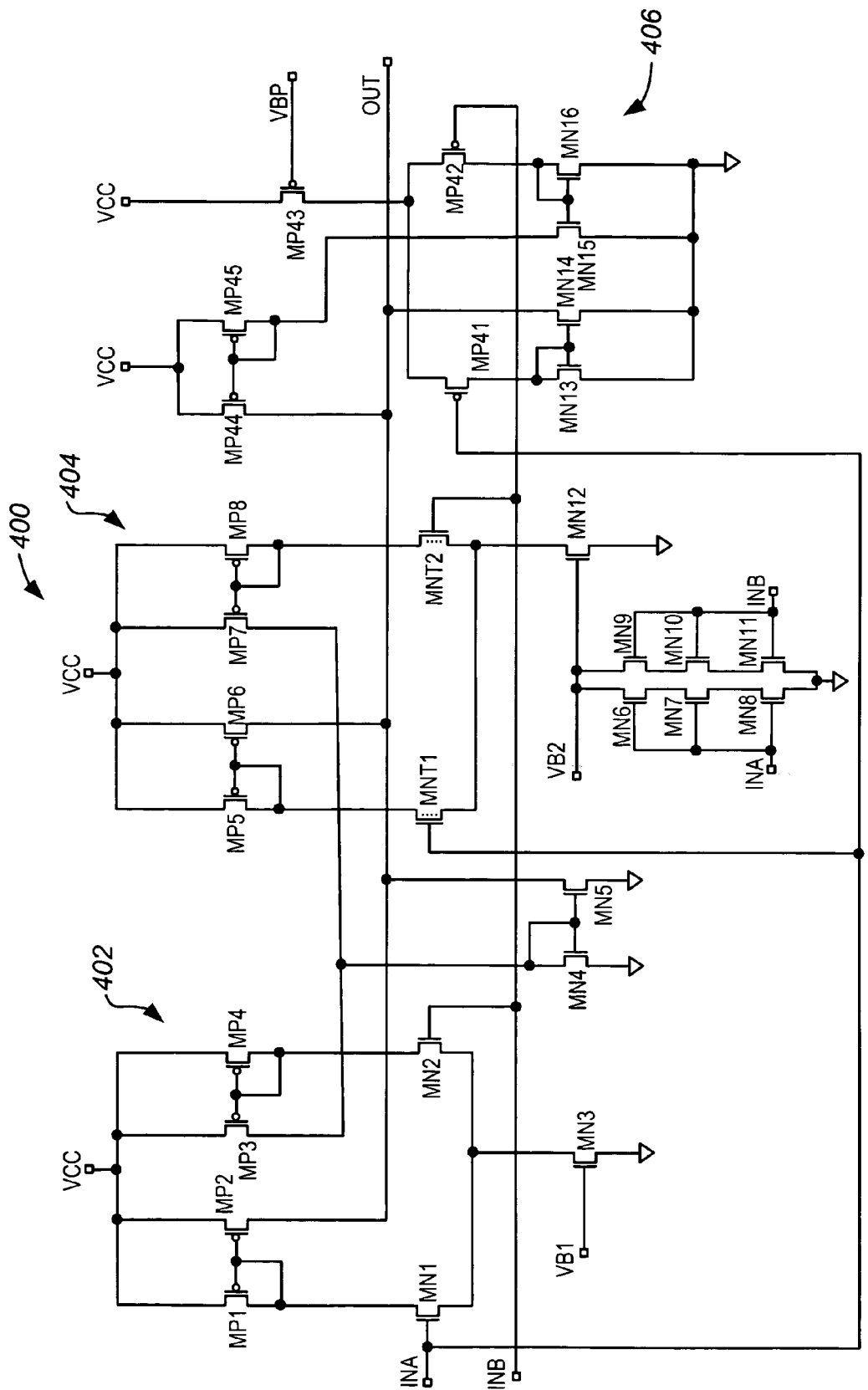
FIG. 4 is a circuit diagram for another differential input buffer according to yet another embodiment of the present invention.

In a variation of the embodiment shown in FIG. 3, the common mode voltage range of the two-amplifier input buffers of the type shown in FIGS. 1 and 2 is increased by connecting in parallel an n-channel differential pair, a ntaive MOS differential pair and a p-channel differential pair. FIG. 4 shows a differential input buffer 400 that includes a first differential pair 402 made of n-channel input transistors MN1 and MN2, a second differential pair 404 made of native MOS input transistors MNT1 and MNT2, and a third differential pair 406 made of p-channel transistors MP41 and MP42, all coupled in parallel between differential input terminals INA and INB and output terminal OUT. First and second differential pairs 402 and 404 are identical to differential pairs 302 and 304 of FIG. 3. Third differential pair 406, however, uses p-channel transistors MP41 and MP42 as its input transistors with n-channel transistors MN13 and MN16 as load transistors. While first and second differential pairs 402 and 404 share their n-channel load devices MN4 and MN5, p-channel differential pair 406 has separate p-channel load transistors MP44 and MP45 that form its second stage with n-channel transistors MN14 and MN15. A p-channel tail transistor MP43 receives an appropriate bias voltage VBP at its gate terminal to set the DC bias current for third differential pair 406.

The operation of input buffer 400 is similar to that of input buffer 300 with a slight variation. For input common mode voltage Vin,cm ranging below 0 volts, third differential pair 406 with p-channel input transistors MP41 and MP42 operates to detect the input logic levels, while the other two differential pairs 402 and 404 remain turned off. In the range 0V<Vin,cm<(VCC−|Vtp|), second differential pair 404 with native MOS transistors MNT1 and MNT2 turns on and third differential pair 406 remains on. In this range both differential amplifiers 404 and 406 drive the output. When Vin,cm reaches VCC−|Vtp|, third differential pair 406 with p-channel input transistors turns off while second differential pair 404 remains on. For the range Vin,cm>1 volt, second differential pair 404 with native transistors MNT1 and MNT2 gradually turns off and first differential pair 402 turns on to detect the input logic levels. Again, all this occurs automatically in response to the differential input signal level and without the need for extra switches to turn any of the differential pairs on or off.

The various embodiments for differential input buffers described above can be used in many different types of integrated circuits. One type of integrated circuit that often requires particular flexibility in terms of its I/O circuitry is the field programmable gate array (FPGA) or programmable logic device (PLD). Today's high-density PLDs are not only used to implement custom logic with quick turn-around, they provide resources that allow them to implement system solutions for applications such as networking, wireless and general high-bandwidth telecommunication among others. Such applications typically require high speed I/O interface solutions with support for a variety of differential I/O standards. To support these varying standards, in alternative embodiments, additional selectively enabled differential pairs can be programmably connected in parallel with other differential pairs to the differential input terminals. Each differential amplifier can be configured to support a particular differential I/O standard and its corresponding input operating range. For example, an input buffer may include more than one differential pair with n-channel input transistors, each configured to respond to a different differential signaling standard. Various embodiments with such selectively enabled differential pairs are described in greater detail in commonly-owned U.S. Pat. No. 6,825,692, to Chung et al., which is hereby incorporated in its entirety.

Figure 5:
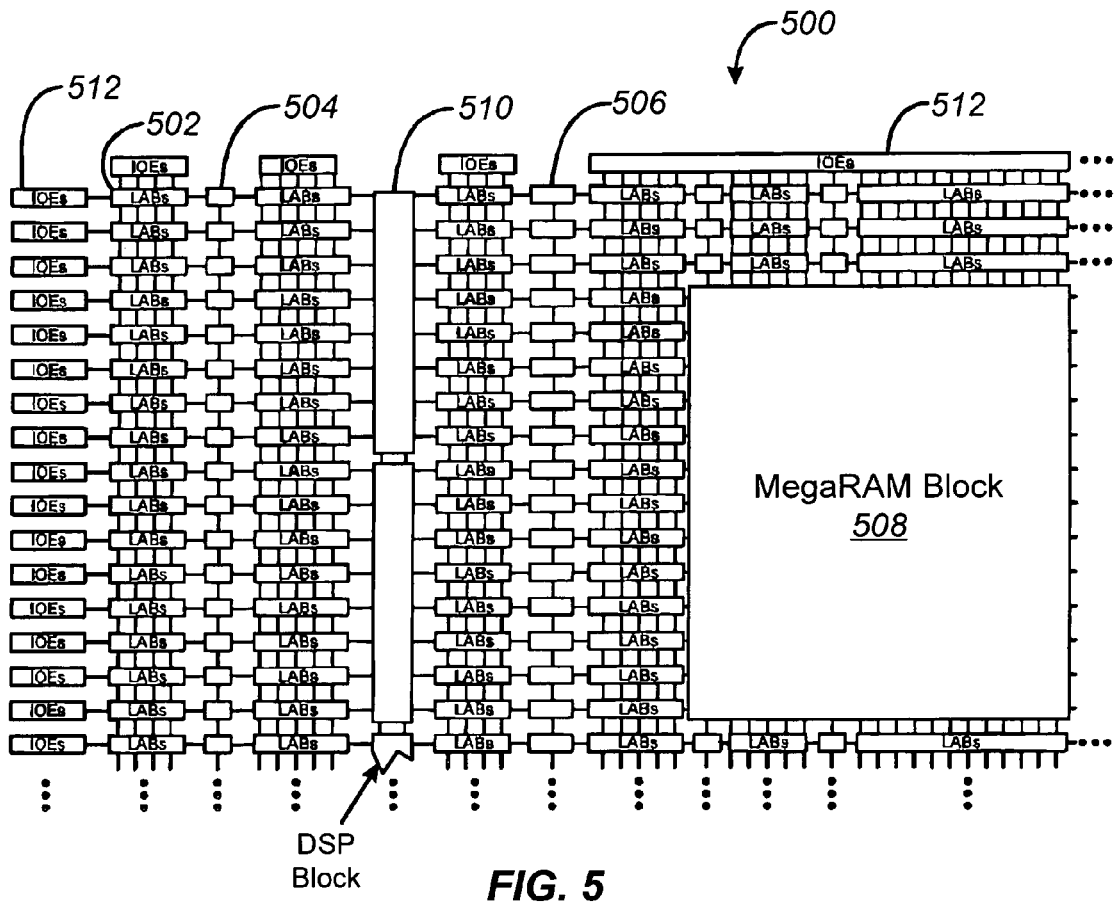
FIG. 5 is a simplified block diagram of a programmable logic device implementing the differential input buffer according to an embodiment of the present invention.

FIG. 5 is a simplified partial block diagram of an exemplary high-density PLD 500 wherein the differential input buffers according to the various embodiments of the present invention can be utilized. PLD 500 includes a two-dimensional array of programmable logic array blocks (or LABs) 502 that are interconnected by a network of column and row interconnects of varying length and speed. LABs 502 include multiple (e.g., 10) logic elements (or LEs), an LE being a small unit of logic that provides for efficient implementation of user defined logic functions. PLD 500 also includes a distributed memory structure including RAM blocks of varying sizes provided throughout the array. The RAM blocks include, for example, 512 bit blocks 504, 4K blocks 606 and a MegaBlock 508 providing 512K bits of RAM. These memory blocks may also include shift registers and FIFO buffers. PLD 500 further includes digital signal processing (DSP) blocks 510 that can implement, for example, multipliers with add or subtract features. I/O elements (IOEs) 512 located, in this example, around the periphery of the device support various differential I/O standards and may also provide single-ended I/O circuitry as well as programmable on-chip termination. An example of a high performance PLD of this type can be found in the Altera Stratix II family of FPGAs. Further details can be found in a handbook at http://www.altera.com/literature/hb/stx2/stratix2_handbook.pdf, which is hereby incorporated by reference in its entirety. It is to be understood that PLD 500 is described herein for illustrative purposes only and that the present invention can be implemented in many different types integrated circuits.

Figure 6:
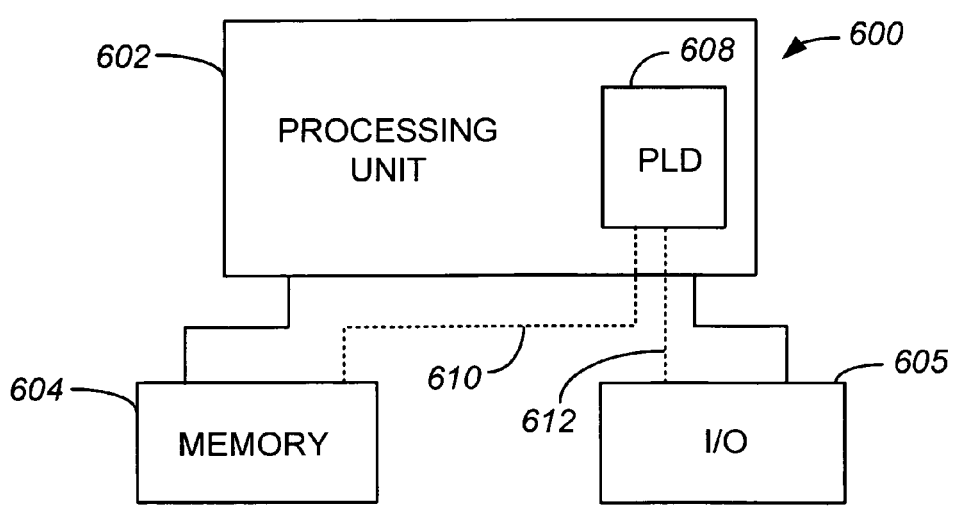
FIG. 6 is a block diagram of an electronic system that embodies differential input buffers according to another embodiment of the present invention.

While PLDs of the type shown in FIG. 5 provide many of the resources required to implement system level solutions, the present invention can also benefit systems wherein a PLD with the I/O structure according to the various embodiments of the invention is one of several components. FIG. 6 shows a block diagram of an exemplary digital system 600, within which the present invention may be embodied. System 600 may be a programmed digital computer system, digital signal processing system, specialized digital switching network, or other processing system. Moreover, such systems may be designed for a wide variety of applications such as telecommunications systems, automotive systems, control systems, consumer electronics, personal computers, Internet communications and networking, and others. Further, system 600 may be provided on a single board, on multiple boards, or within multiple enclosures.

System 600 includes a processing unit 602, a memory unit 604 and an I/O unit 606 interconnected together by one or more buses. According to this exemplary embodiment, a programmable logic device 608 is embedded in processing unit 602. PLD 608 may serve many different purposes within the system in FIG. 6. PLD 608 may, for example, be a logical building block of processing unit 602, supporting its internal and external operations. PLD 608 is programmed to implement the logical functions necessary to carry on its particular role in system operation. PLD 608 may be specially coupled to memory 604 through connection 610 and to I/O unit 606 through connection 612. Processing unit 602 may direct data to an appropriate system component for processing or storage, execute a program stored in memory 604 or receive and transmit data via I/O unit 606, or other similar function. Processing unit 602 may be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU. For example, instead of a CPU, one or more PLDs 608 may control the logical operations of the system. In an embodiment, PLD 608 acts as a reconfigurable processor, which can be reprogrammed as needed to handle a particular computing task. Alternately, programmable logic device 608 may itself include an embedded microprocessor. Memory unit 604 may be a random access memory (RAM), read only memory (ROM), fixed or flexible disk media, PC Card flash disk memory, tape, or any other storage means, or any combination of these storage means.

The present invention thus provides various techniques for implementing high speed differential input buffers that can operate at very lower power supply voltages and can support wider input common mode voltage range. While the above provides a complete description of specific embodiments that are illustrative of the present invention, it is possible to use various alternatives, modifications and equivalents. For example, those skilled in the art appreciate that the polarity of the transistors can be reversed for the various differential amplifiers while maintaining the advantages of the circuit. It is possible, for example, to use depletion mode p-channel transistors or p-channel native MOS transistors in combination with the other types of transistors to implement differential input buffers according to the principles of the invention. Therefore, the scope of the present invention should not be limited to the specific and illustrative embodiments described above, and should instead be determined with reference to the appended claims along with their full scope of equivalents.

What is claimed is:

1. A differential input buffer having first and second input terminals coupled to receive a differential signal and an output terminal, the differential input buffer comprising:

a first differential amplifier having a first enhancement mode MOS input transistor with a gate terminal coupled to the first input terminal and a second enhancement mode MOS input transistor with a gate terminal coupled to the second input terminal, the first differential amplifier further having an output terminal coupled to the output terminal of the differential input buffer;

a second differential amplifier having a first native MOS input transistor with a gate terminal coupled to the first input terminal and a second native MOS input transistor with a gate terminal coupled to the second input terminal, the second differential amplifier further having an output terminal coupled to the output terminal of the differential input buffer; and a native pair shut-off circuit coupled to the second differential amplifier and configured to turn off the second differential amplifier in response to the differential input signal.

2. The input buffer of claim 1 wherein the second differential amplifier further comprises a first enhancement mode MOS tail transistor coupled to a common-source node between the first and second native MOS input transistors, the first enhancement mode MOS tail transistor having a gate terminal configured to receive a signal that sets a current for the second differential pair circuit.

3. The input buffer of claim 2 wherein the native pair shut-off circuit comprises:

a first plurality of enhancement mode MOS transistors serially coupled between the gate terminal of the first enhancement mode MOS tail transistor and a power supply line; and a second plurality of enhancement mode MOS transistors serially coupled between the gate terminal of the first enhancement mode MOS tail transistor and the power supply.

4. The input buffer of claim 3 wherein gate terminals of the first plurality of enhancement mode MOS transistors in the native pair shut-off circuit couple to the first input terminal, and gate terminals of the second plurality of enhancement mode MOS transistors in the native pair shut-off circuit couple to the second input terminal.

5. The input buffer of claim 4 wherein the first and second plurality of enhancement mode MOS transistors in the native pair shut-off circuit each comprise three transistors.

6. The input buffer of claim 1 wherein the first and second enhancement mode MOS input transistors and the first and second native MOS input transistors are of n-channel type.

7. The input buffer of claim 1 wherein each of the first and second differential amplifiers further comprises:

a first pair of enhancement mode MOS load transistors that respectively couple between the input transistors and a power supply line, and a second pair of enhancement mode MOS load transistors cross-couple between drain terminals of the input transistors and the power supply line.

8. The input buffer of claim 1 further comprising:

a third differential amplifier having a first depletion mode MOS input transistor with a gate terminal coupled to the first input terminal and a second depletion mode MOS input transistor with a gate terminal coupled to the second input terminal, the third differential amplifier further having an output terminal coupled to the output terminal of the differential input buffer; and a depletion pair shut-off circuit coupled to the third differential amplifier and configured to turn off the third differential amplifier in response to the differential input signal.

9. The input buffer of claim 8 wherein the third differential amplifier further comprises a second enhancement mode MOS tail transistor coupled to a common-source node between the first and second depletion mode MOS input transistors, the second enhancement mode MOS tail transistor having a gate terminal configured to receive a signal that sets a current for the third differential pair circuit.

10. The input buffer of claim 9 wherein the depletion pair shut-off circuit comprises:

a first plurality of native MOS transistors serially coupled between the gate terminal of the second enhancement mode MOS tail transistor and the power supply line; and a second plurality of native MOS transistors serially coupled between the gate terminal of the second enhancement mode MOS tail transistor and the power supply.

11. The input buffer of claim 10 wherein gate terminals of the first plurality of native MOS transistors in the depletion pair shut-off circuit couple to the first input terminal, and gate terminals of the second plurality of native MOS transistors in the depletion pair shut-off circuit couple to the second input terminal.

12. The input buffer of claim 6 further comprising a third differential amplifier having a first p-channel MOS input transistor with a gate terminal coupled to the first input terminal and a second p-channel MOS input transistor with a gate terminal coupled to the second input terminal, the third differential amplifier further having an output terminal coupled to the output terminal of the differential input buffer.

13. The differential input buffer of claim 6 wherein each of the first and second differential amplifiers comprises a second stage, and wherein load devices in the second stage of each of the first and second differential amplifiers are shared.

14. The differential input buffer of claim 8 wherein the first and second enhancement mode MOS input transistors, the first and second native MOS input transistors and the first and second depletion mode MOS input transistors are of n-channel type.

15. The differential input circuit of claim 14 wherein each of the first, second and third differential amplifiers comprises a second stage, and wherein load devices in the second stage of each of the first, second and third differential amplifiers are shared.

16. A differential input buffer having first and second input terminals coupled to receive a differential signal and an output terminal, the differential input buffer comprising:

a first differential amplifier having a first enhancement mode MOS input transistor with a gate terminal coupled to the first input terminal and a second enhancement mode MOS input transistor with a gate terminal coupled to the second input terminal, the first differential amplifier further having an output terminal coupled to the output terminal of the differential input buffer;

a second differential amplifier having a first depletion mode MOS input transistor with a gate terminal coupled to the first input terminal and a second depletion mode MOS input transistors with a gate terminal coupled to the second input terminal, the second differential amplifier further having an output terminal coupled to the output terminal of the differential input buffer; and a depletion pair shut-off circuit coupled to the second differential amplifier and configured to turn off the second differential amplifier in response to the differential input signal.

17. The differential input buffer of claim 16 wherein the second differential amplifier further comprises an enhancement mode MOS tail transistor coupled to a common-source node between the first and second depletion mode MOS input transistors, the first enhancement mode MOS tail transistor having a gate terminal configured to receive a signal that sets a current for the second differential pair circuit.

18. The differential input buffer of claim 17 wherein the depletion pair shut-off circuit comprises:

a first plurality of enhancement mode MOS transistors serially coupled between the gate terminal of the enhancement mode MOS tail transistor and a power supply line; and a second plurality of enhancement mode MOS transistors serially coupled between the gate terminal of the first enhancement mode MOS tail transistor and the power supply.

19. The differential input buffer of claim 18 wherein gate terminals of the first plurality of enhancement mode MOS transistors in the depletion pair shut-off circuit couple to the first input terminal, and gate terminals of the second plurality of enhancement mode MOS transistors in the depletion pair shut-off circuit couple to the second input terminal.

20. The differential input buffer of claim 19 wherein the first and second plurality of enhancement mode MOS transistors in the depletion pair shut-off circuit each comprise three transistors.

21. The differential input buffer of claim 16 wherein the first and second enhancement mode MOS input transistors and the first and second depletion mode MOS input transistors are of n-channel type.

22. The differential input buffer of claim 16 wherein each of the first and second differential amplifiers further comprises:

a first pair of enhancement mode MOS load transistors that respectively couple between the input transistors and a power supply line, and a second pair of enhancement mode MOS load transistors cross-couple between drain terminals of the input transistors and the power supply line.

23. An input buffer comprising:

a first differential pair circuit including:

a first enhancement mode MOS input transistor coupled to a first input terminal, a second enhancement mode MOS input transistor coupled to a second input terminal, the first and second enhancement mode MOS input transistors being coupled together at a first common-source node, first and second load transistors respectively coupled between the first and second enhancement mode MOS input transistors and a first power supply line, a first tail transistor coupled between the first common-source node and a second power supply line, and configured to receive a first bias voltage at its gate terminal, and a second stage having switching and load transistors coupled to an output terminal;

a second differential pair circuit including:

a first native MOS input transistor coupled to the first input terminal, a second native MOS input transistor coupled to the second input terminal, the first and second native MOS input transistors being coupled together at a second common-source node, first and second load transistors respectively coupled between the first and second native MOS input transistors and the first power supply line, a second tail transistor coupled between the second common-source node and the second power supply line, and configured to receive a second bias voltage at its gate terminal, a second stage having switching and load transistors coupled to the output terminal; and a shut-off circuit coupled to the gate terminal of the second tail transistor and configured to gradually turn off the second tail transistor in response to a differential signal at the first and second input terminals.

24. The input buffer of claim 23 wherein the second stage of the first differential pair and the second stage of the second differential pair share their respective load transistors.

25. The input buffer of claim 23 wherein the shut-off circuit comprises:

a first plurality of enhancement mode MOS transistors serially coupled between the gate terminal of the second tail transistor and the second power supply line; and a second plurality of enhancement mode MOS transistors serially coupled between the gate terminal of the second tail transistor and the second power supply.

26. The input buffer of claim 25 wherein gate terminals of the first plurality of enhancement mode MOS transistors in the shut-off circuit couple to the first input terminal, and gate terminals of the second plurality of enhancement mode MOS transistors in the shut-off circuit couple to the second input terminal.

27. The input buffer of claim 26 wherein the first and second plurality of enhancement mode MOS transistors in the shut-off circuit each comprise three transistors.

28. The input buffer of claim 23 wherein the first and second enhancement mode MOS input transistors and the first and second native MOS transistors are of n-channel type.

29. The input buffer of claim 28 wherein each of the first and second differential pair circuits further comprises third and fourth load transistors cross-couple between drain terminals of the input transistors and the power supply line.

* * * * *